US006959180B2

United States Patent
Ji

(10) Patent No.: US 6,959,180 B2
(45) Date of Patent: *Oct. 25, 2005

(54) LTCC FET MIXER

(76) Inventor: Daxiong Ji, 1968 E. 26 St., Brooklyn, NY (US) 11229

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 441 days.

(21) Appl. No.: 10/308,808

(22) Filed: Dec. 4, 2002

(65) Prior Publication Data

US 2003/0151136 A1    Aug. 14, 2003

Related U.S. Application Data

(60) Provisional application No. 60/351,489, filed on Jan. 28, 2002.

(51) Int. Cl.[7] .............................. H04B 1/28; H04B 1/26
(52) U.S. Cl. ....................... 455/333; 455/326; 327/208
(58) Field of Search ................................ 455/313, 323, 455/324, 325, 326, 333, 334, 338, 130, 280, 455/293; 327/206, 207, 208, 210, 220, 272, 327/329, 355, 359

(56) References Cited

U.S. PATENT DOCUMENTS 6,348,830 B1 *   2/2002   Rebeiz et al. ............... 327/355
6,427,069 B1 *   7/2002   Galin ......................... 455/326

\* cited by examiner

Primary Examiner—Quochien B. Vuong
(74) Attorney, Agent, or Firm—Kevin Redmond

(57) ABSTRACT

A wide bandwidth mixer has a low temperature co-fired ceramic substrate. The substrate has a top layer, a bottom layer and inner layers. Vias extend through the substrate. A local oscillator balun and an RF balun are located on the inner layers and connected to the vias. An intermediate frequency balun is mounted to the top layer and connected to the vias. Field effect transistors are mounted on the top layer and connected to the local oscillator balun, the RF balun and the intermediate frequency balun through the vias. A matching network is mounted to the top layer and is connected to the vias. The matching network matches the impedance of the field effect transistors to that at the LO port.

28 Claims, 12 Drawing Sheets

LTCC FET MIXER

CROSS REFERENCE TO RELATED AND CO-PENDING APPLICATIONS

This application claims the benefit of Provisional Application No. 60/351,489, filed Jan. 28, 2002.

This application is related to U.S. patent application Ser. No. 60/326,819 and U.S. patent application Ser. No. 60/356,345.

BACKGROUND

1. Field of the Invention

This invention relates to mixers in general and more particularly to a field effect transistor mixer that has high IP3 and provides wide bandwidth in a small package size.

2. Description of Related Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal. The difference or IF frequency is a result of the non-linearity of the mixer. Along with the IF frequency, the mixer typically generates inter-modulation products due to the non-linearity response.

The communication systems of today operate in a multi-carrier environment. When more than one carrier arrives at the receiver, they mix and generate inter-modulation products. One inter-modulation product that causes problems is the third order inter-modulation product. The third order product is close to the carrier frequency and can be difficult to filter out. A measure this third order product is called IP3. Good design techniques can be used to build a high IP3 mixer circuit. Below 2 GHz, such mixers are produced using a ferrite balun transformer. Unfortunately, the ferrite balun transformer is difficult to repeatedly produce. Variations in tightness of the windings, magnet wire twist rate and permeability/permissivity of the ferrite material cause a lowering of the IP3 value. The ferrite transformers are large and require excessive circuit board space. In addition the ferrite transformers are difficult to assemble to a circuit board requiring a lengthy manual assembly process by a skilled operator. This adds undesirable cost to the product and is difficult for large scale manufacturing.

The variation of the ferrite balun transformer effects the LO balun the most where the high impedance of a transistor gate creates a mis-match with the LO port. Typically, it is desired that the LO port have an impedance of 50 ohms. This impedance mis-match limits the bandwidth that the mixer can handle. Mixers with a poor impedance match at the LO port can only handle narrow bandwidths. In order to cover a wide bandwidth, several mixers could be used, one for differing bandwidth ranges. However, this would be very expensive and require excessive circuit board space. Several prior art mixer circuits are well known and have been described in the prior art.

While various mixers have been used, they have suffered from not being able to handle wide bandwidths with high values of IP3 (low inter-modulation products), being difficult to assemble, expensive to produce and requiring excessive circuit board space.

A current unmet need exists for a mixer that is compact, can be assembled at low cost and that can handle wide frequency bandwidths with low levels of third order inter-modulation products.

SUMMARY

It is a feature of the invention to provide a wide bandwidth mixer for mixing an RF input signal with a local oscillator signal to provide at an output an intermediate frequency signal with a small package size that is easily assembled at low cost.

Another feature of the invention is to provide a wide bandwidth mixer that includes a substrate formed from a plurality of layers of fired low temperature co-fired ceramic. The substrate has a top layer, a bottom layer and inner layers. Several vias extend through the substrate. A local oscillator balun and an RF balun are located on the inner layers and are electrically connected to the vias. The local oscillator balun is adapted to receive a local oscillator signal. The RF balun is adapted to receive an RF signal. An intermediate frequency balun is mounted to the top layer and is electrically connected to the vias. The intermediate frequency balun is adapted to provide an intermediate frequency signal. Several field effect transistors are mounted on the top layer. The transistors are electrically connected to the local oscillator balun, the RF balun and the intermediate frequency balun through the vias. The transistors mix the local oscillator signal with the RF signal to provide the intermediate frequency signal. A matching network is mounted to the top layer and is electrically connected to the vias. The matching network matches the impedance of the field effect transistors to that at an LO port.

BRIEF DESCRIPTION OF THE DRAWINGS

FIG. 16 is a graph of VSWR versus frequency for the LO and RF ports.

FIG. 17 is a graph of VSWR versus frequency for the IF port.

FIG. 18 is a table of electrical parameters for several mixers built in accordance with the present invention.

It is noted that the drawings of the invention are not to scale. In the drawings, like numbering represents like elements between the drawings.

DETAILED DESCRIPTION

Figure 1:
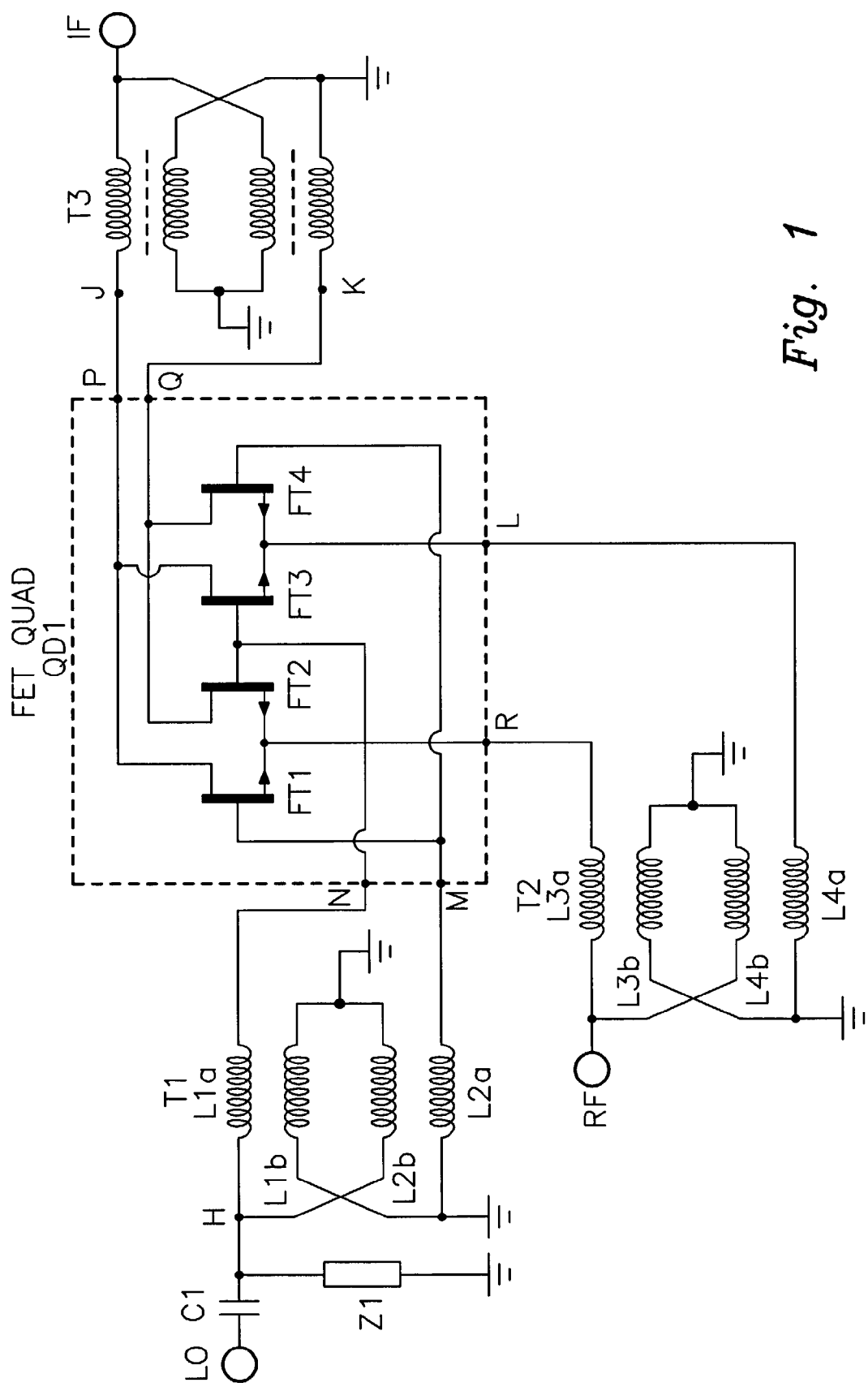
FIG. 1 is a schematic drawing of a wide bandwidth mixer in accordance with the present invention.

FIG. 1 shows a schematic drawing of the present invention. Mixer 20 has a local oscillator input terminal LO for receiving a local oscillator signal, an RF input terminal RF for receiving an RF signal and an intermediate frequency output terminal IF for providing an intermediate frequency output signal.

A semiconductor die or FET quad QD1 has four field effect transistors FT1, FT2, FT3 and FT4. Each transistor has a source, S1, S2, S3, S4, a gate G1, G2, G3, G4 and a drain D1, D2, D3, D4. The gate G1 is connected to node M. The gates G2 and G3 are connected together to node N. The gate G4 is connected to node M.

The sources S1 and S2 are connected together to node R. The sources S3 and S4 are connected together to node L. The drains D1 and D3 are connected together at node P. The drains D2 and D4 are connected together at node Q.

Local oscillator port LO is connected to local oscillator balun transformer T1. Transformer T1 has windings L1a, L1b, L2a and L2b. Windings L1a and L1b are electromagnetically coupled as are windings L2a and L2b. Winding L1a has one end connected to node H and the other end connected to node N. Winding L1b has both ends connected to ground. Winding L2a has one end connected to node M and the other end connected to ground. Winding L2b has one end connected to node H and the other end connected to ground. Balun T1 is a 4:1 balun.

A matching network 95 is connected between terminal LO and balun T1. Matching network 95 has a capacitor C1. Capacitor C1 has one end connected to terminal LO and another end connected to node H. An impedance Z1 is connected between a ground and node H. The impedance Z1 can be inductive or capacitive. In the case where Z1 is inductive, Z1 is an inductor. In the case where Z1 is capacitive, Z1 is a capacitor. Therefore, the local oscillator signal is connected to the mixer 20 through matching network 95.

Figure 10:
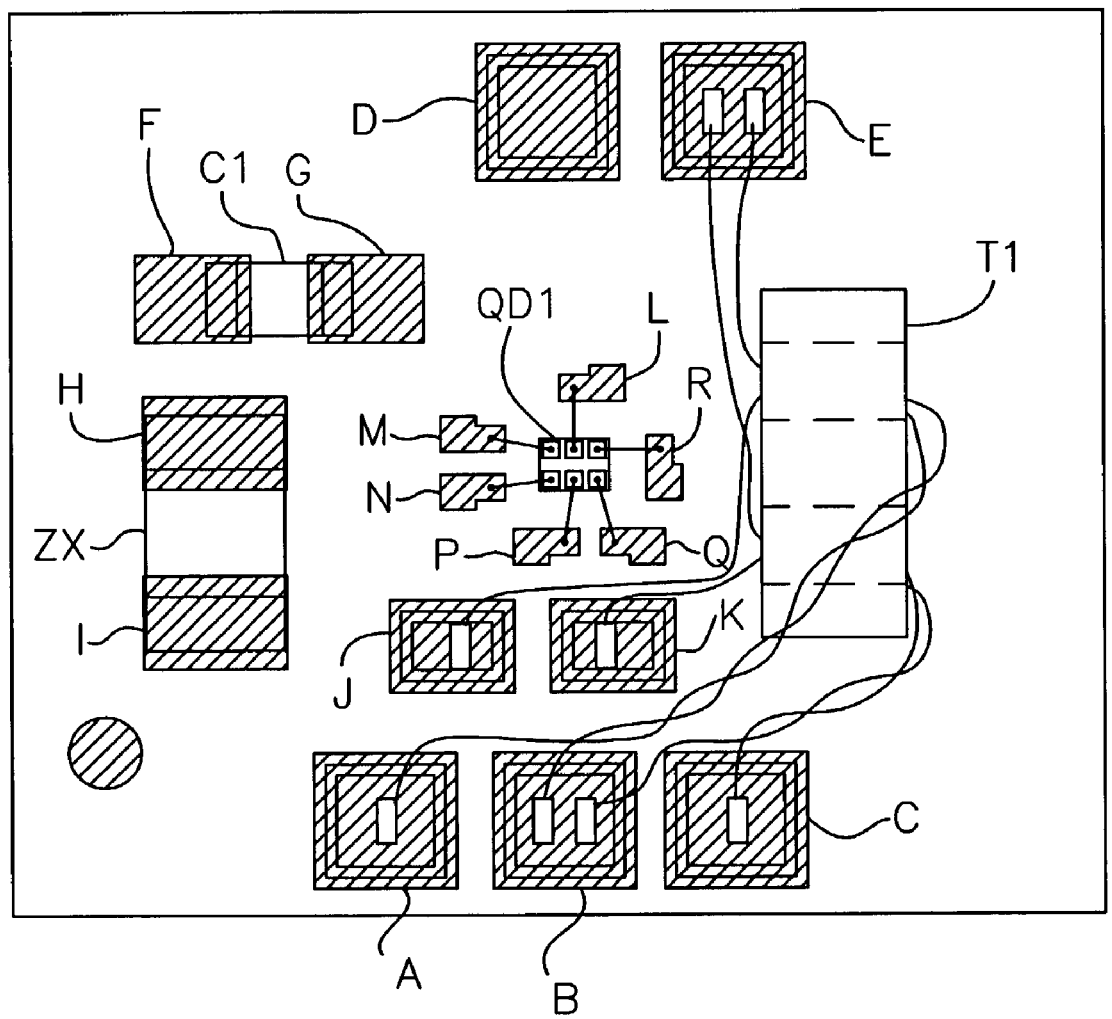
FIG. 10 is a top view of FIG. 9.
Figure 11:
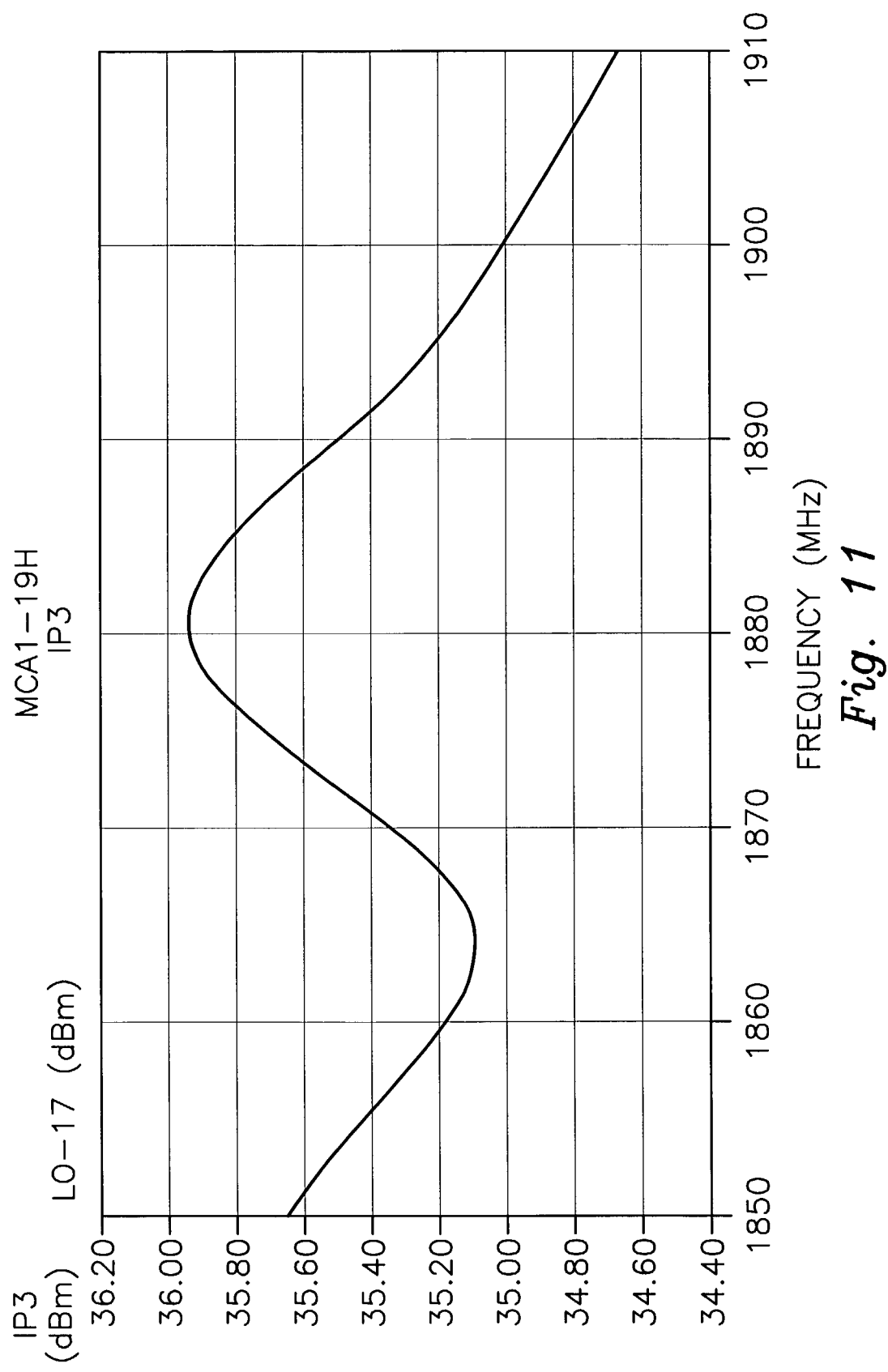
FIG. 11 is a top view of layer 28 of FIG. 9.
Figure 12:
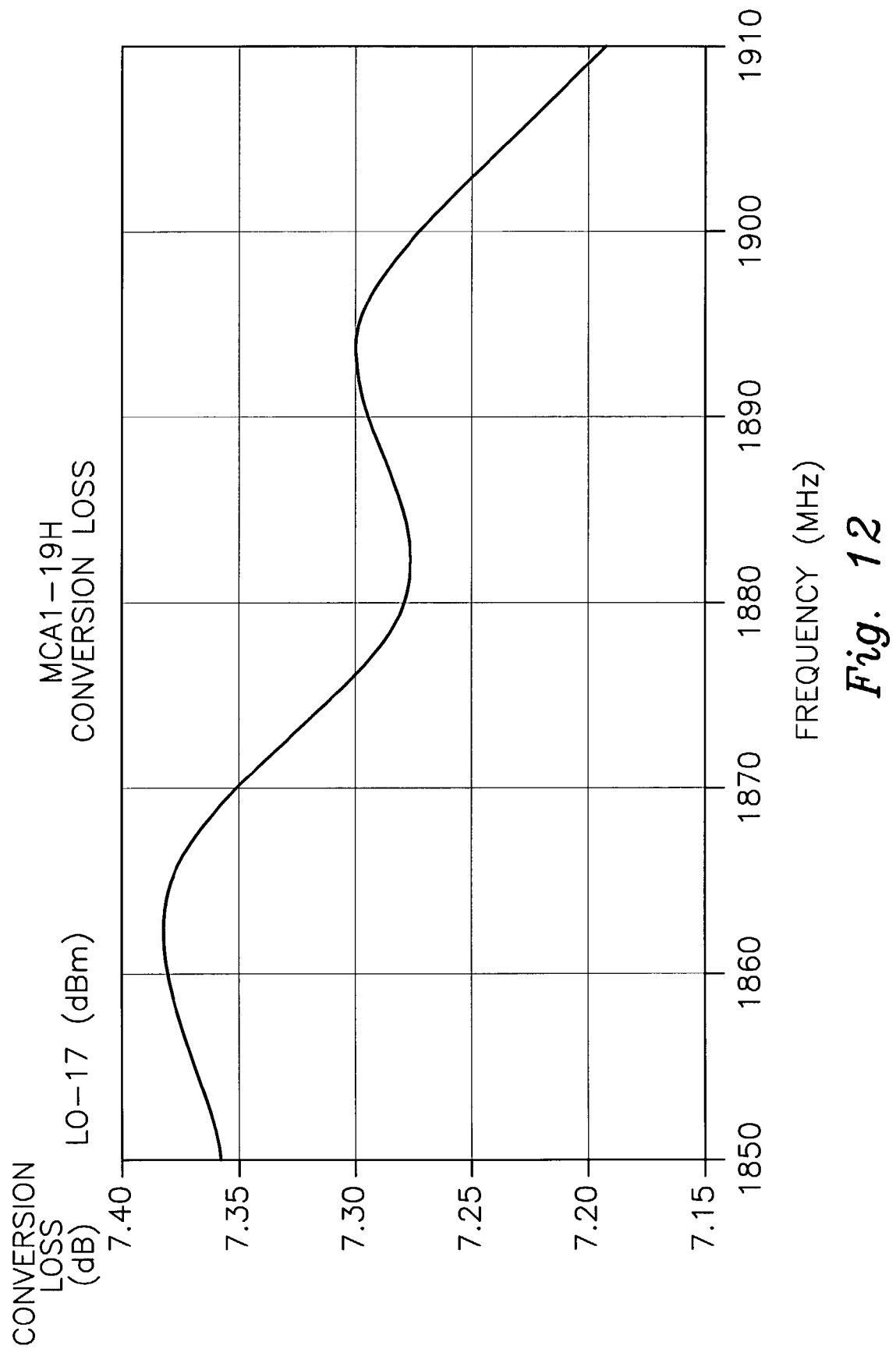
FIG. 12 is a top view of layer 30 of FIG. 9.

Intermediate frequency output port IF is connected to intermediate frequency balun T3. Balun T3 has wire windings L5a, L5b, L6a and L6b. Windings L5a and L5b are electromagnetically coupled and wound on a leg of a ferrite binocular core 80 (FIG. 10). Similarly, windings L6a and L6b are magnetically coupled and wound on another leg of a ferrite binocular core 80 (FIG. 10). Winding L5a has one end connected to node J and the other end connected to terminal IF. Winding L5b has both ends connected to ground. Winding L6a has one end connected to node K and the other end connected to ground. Winding L6b has one end connected to ground and the other end connected to terminal IF. Thus the Intermediate frequency signal IF is connected output port IF through balun T3. Balun T3 is a 4:1 balun.

RF input port RF is connected to RF balun transformer T2. Balun T2 has windings L3a, L3b, L4a and L4b. Windings L3a and L3b are electromagnetically coupled as are windings L4a and L4b. Winding L3a has one end connected to port RF and the other end connected to node R. Winding L3b has both ends connected to ground. Winding L4a has one end connected to node L and the other end connected to ground. Winding L4b has one end connected to port RF and the other end connected to ground. Thus, the RF signal is connected to mixer 20 through balun transformer T2. Balun T2 is a 4:1 balun.

Figure 2:
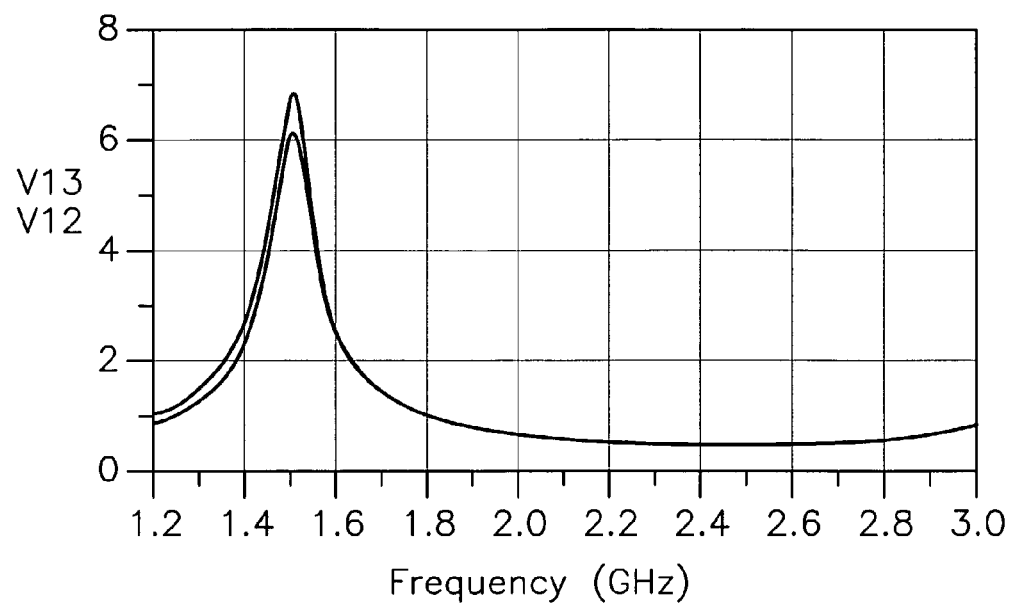
FIG. 2 is a graph of gate voltage versus frequency when C1 is 1.2 pf and Z1 is capacitive with a value of 5.6 pf for the circuit of FIG. 1.
Figure 3:
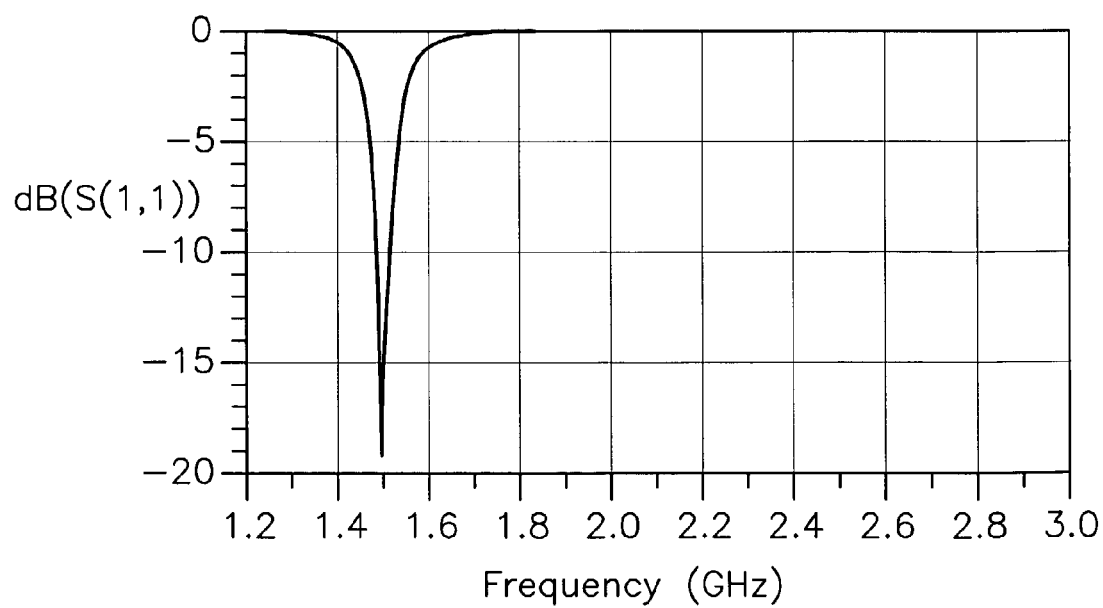
FIG. 3 is a graph of LO return loss versus frequency when C1 is 1.2 pf and Z1 is capacitive with a value of 5.6 pf.

Referring to FIG. 2, the gate voltage versus frequency for the circuit of FIG. 1 is shown when C1 has a value of 1.2 pf and Z1 is capacitive with a value of 5.6 pf. Assume that the gate impedance is 10K ohm and that LO is 17 dBm. The gate voltage is centered at 1.5 GHz. The voltage is 6.5 volts which drives the field effect transistors on or off depending upon polarity. FIG. 3 is a graph of LO return loss versus frequency when C1 is 1.2 pf and Z1 is capacitive with a value of 5.6 pf. The return loss is 19 db which indicates an excellent impedance match.

Figure 4:
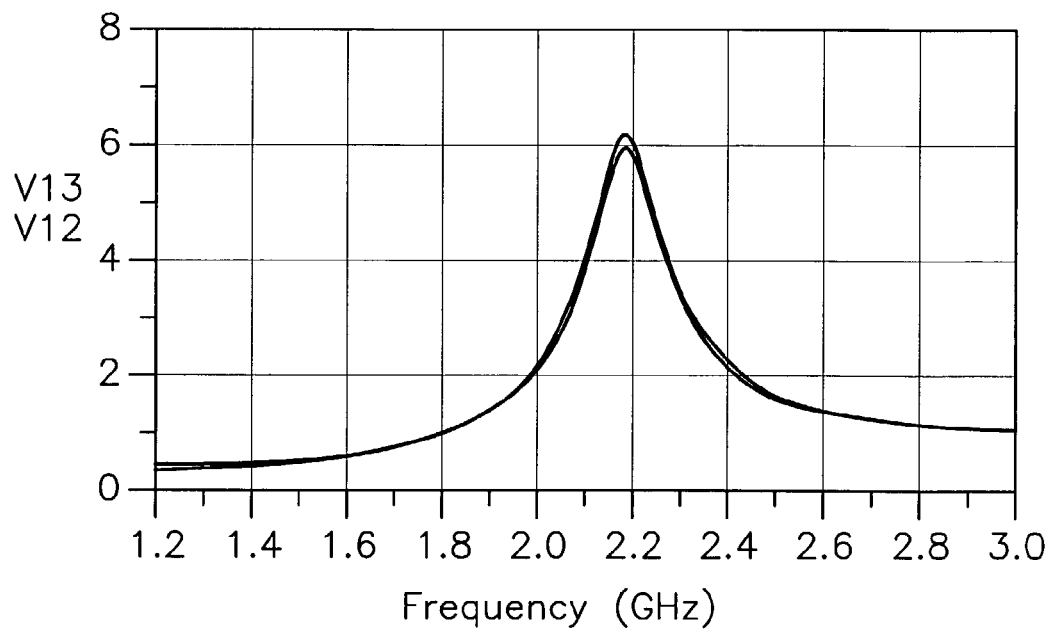
FIG. 4 is a graph of gate voltage versus frequency when C1 is 0.5 pf and Z1 is open.
Figure 5:
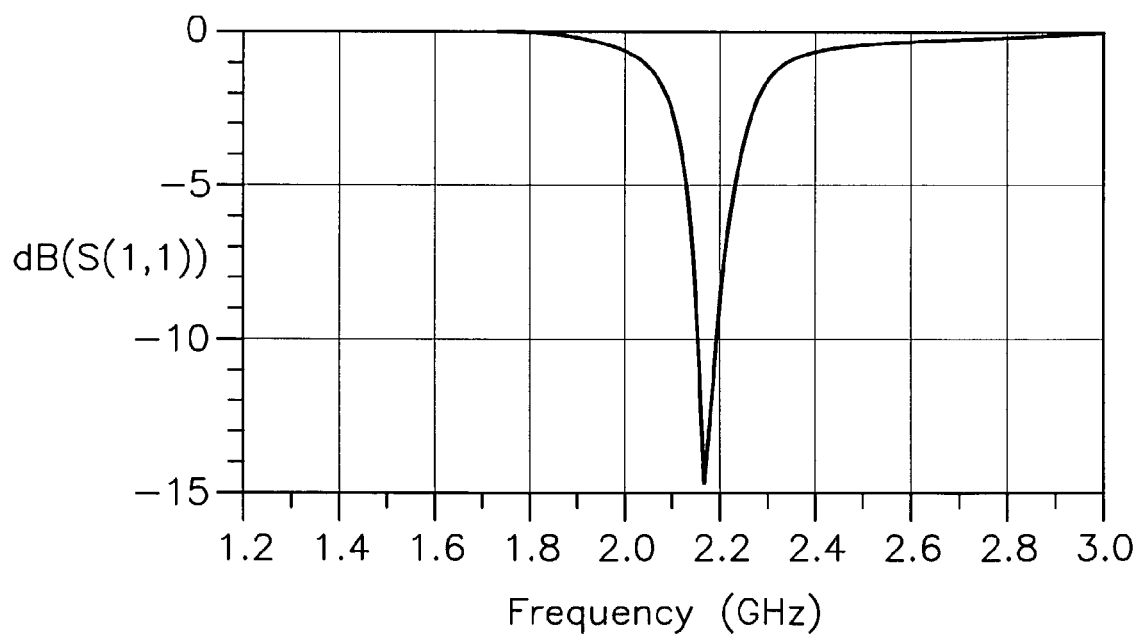
FIG. 5 is a graph of LO return loss versus frequency when C1 is 0.5 pf and Z1 is open.

Referring to FIG. 4, the gate voltage versus frequency for the circuit of FIG. 1 is shown when C1 has a value of 0.5 pf and Z1 is open. The gate voltage is centered at 2.18 GHz. FIG. 5 is a graph of LO return loss versus frequency when C1 has a value of 0.5 pf and Z1 is open. The return loss is 14 db which indicates an excellent impedance match.

Figure 6:
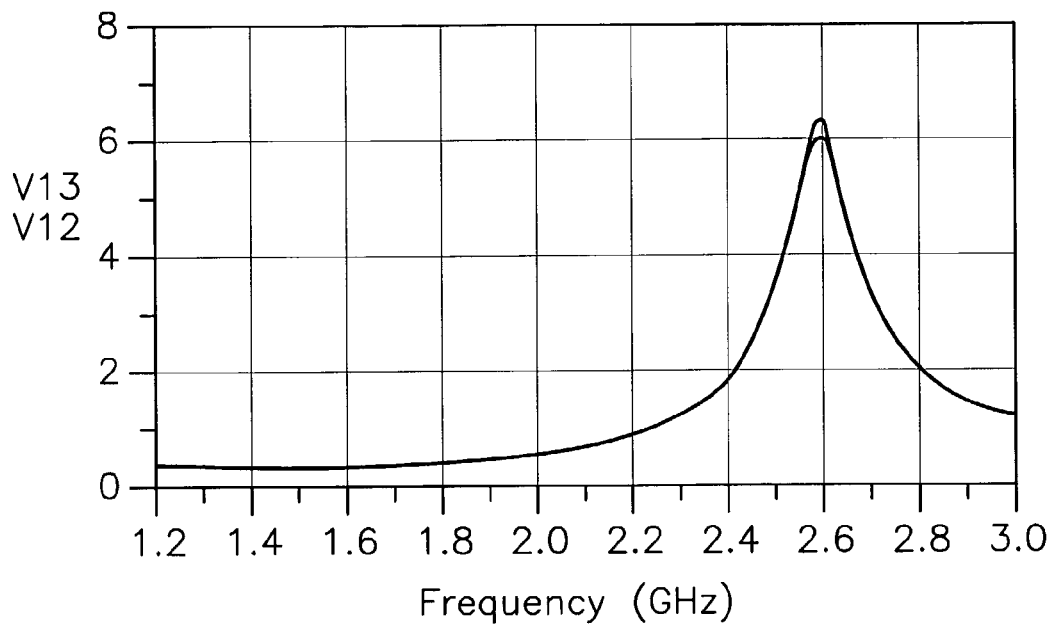
FIG. 6 is a graph of gate voltage versus frequency when C1 is 0.5 pf and Z1 is inductive with a value of 2.7 nh.
Figure 7:
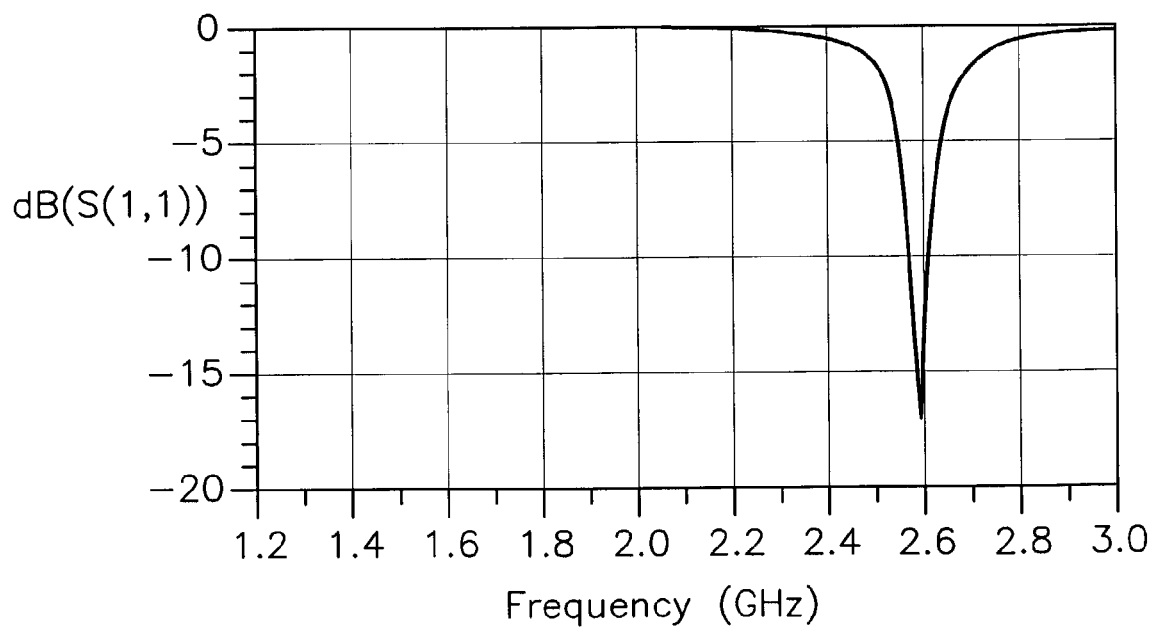
FIG. 7 is a graph of LO return loss versus frequency when C1 is 0.5 pf and Z1 is inductive with a value of 2.7 nh.

FIG. 6 is a graph of gate voltage versus frequency when C1 is 0.5 pf and Z1 is inductive with a value of 2.7 nh. The voltage is 6 volts with the frequency centered at 2.6 GHz. FIG. 7 shows LO return loss versus frequency when C1 is 0.5 pf and Z1 is inductive with a value of 2.7 nh. The return loss is 18 db which is an excellent impedance match.

Figure 8:
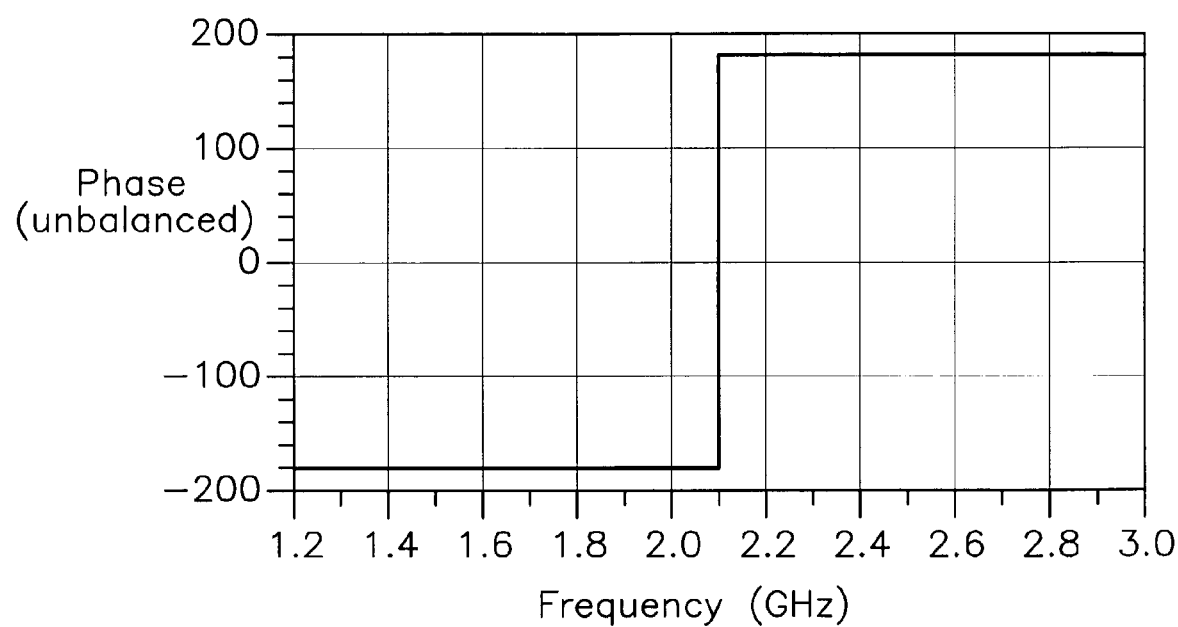
FIG. 8 is a graph of phase unbalance versus frequency from the LO balun to the gates.

FIG. 8 is a graph of phase unbalance versus frequency from the LO balun to the gates. The phase unbalance is 180 degrees over 1.5 to 2.6 GHz. This shows that the output of the LO balun provides opposite polarity signals to drive the gates into on and off states.

Therefore, by the selection of the proper values for capacitor C1 and impedance Z1, a wideband mixer with good matching can be obtained. In this example, the frequencies of 1.5, 2.18 and 2.6 GHz were used. For other frequencies between 1.5 and 2.6 GHz, the values of capacitor C1 and impedance Z1 can be computed. If the LO balun is designed to cover the frequencies of 1.5 to 2.6 GHz, the values chosen for capacitor C1 and impedance Z1 determines the frequency of operation at the LO port or terminal.

Field effect transistors that are switched on have low DC resistance from drain to source. Field effect transistors that are switched off have high DC resistance from drain to source. During one half cycle of the LO signal (positive or negative), field effect transistors FT2 and FT3 are on and transistors FT1 and FT4 are off. The winding L3a of the RF balun at node R is directly connected to the winding L6a of the IF balun at node Q which is connected to node K. The winding L4a of the RF balun at node L is directly connected to the winding L5a of the IF balun at node P which is connected to node J.

During, the other half of the LO cycle (positive or negative), the reverse occurs. During one half cycle of the LO signal, field effect transistors FT1 and FT4 are on and transistors FT2 and FT3 are off. The winding L3a of the RF balun at node R is directly connected to the winding L5a of the IF balun at node P which is connected to node J. The winding L4a of the RF balun at node L is directly connected to the winding L6a of the IF balun at node Q which is connected to node K.

The result is equivalent to connecting the secondary of the RF balun to the secondary of the IF balun in one half of the LO cycle and switching the polarity of the RF balun to IF during the second half of the LO cycle. This is equivalent to mathematical multiplication or mixing of the RF signal by the LO signal and generates a sum and a difference of the LO and RF signals. Normally, the difference frequency is used in down converter applications and the sum frequency is used in up converter applications. A suitable filter rejects the unwanted products. A high value of IP3 is obtained due the linear characteristics of the field effect transistors.

Referring now to FIGS. 9–12, the wide bandwidth mixer 20 shown in the schematic of FIG. 1 is realized in a physical package. Mixer 20 has a low temperature co-fired ceramic (LTCC) structure or substrate 22. LTTC substrate 22 is comprised of multiple layers of LTCC material. There are nine LTCC layers in total. Planar layers 24, 26, 28, 30, 32, 34, 36, 38 and 40 are all stacked on top of each other and form a unitary structure 22 after firing in an oven. Layer 24 is the top layer, layer 40 is the bottom layer and layers 26, 28, 30, 32, 36 and 38 form inner layers 42. LTCC layers 24–40 are commercially available in the form of a green unfired tape. Each of the layers has a top surface 24A, 26A, 28A, 30A, 32A, 34A, 36A, 38A and 40A. Similarly, each of the layers has a bottom surface 24B, 26B, 28B, 30B, 32B, 34B, 36B, 38B and 40B. The layers have several circuit features that are patterned on the surfaces. Multiple vias 50 extend through each of the layers. Vias 50 are formed from an electrically conductive material and electrically connect the circuit features on one layer to the circuit features on another layer.

Layer 24 has several circuit features that are patterned on surface 24A. Surface 24A has contact pads A, B, C, D, E, J and K, capacitor pads F and G, impedance pads H and I, and wire bond pads L, M, N, P, Q and R. Layer 26 has several circuit lines 62 that are patterned on surface 26A. Vias 50 connect circuit lines 62 and the pads on layers 24 and 28. Layer 28 has four windings L1a, L2a, L3a and L4a patterned on surface 28A. Similarly, layer 30 has four windings L1b, L2b, L3b and L4b patterned on surface 30A. The windings are shaped as spiral lines on surfaces 28A and 30A. Windings L1a, L1b and L2a and L2b form balun T1. Windings L3a, L3b and L4a and L4b form balun T2. The a and b windings are electromagnetically coupled through the dielectric of layer 28. The windings are connected to respective vias 50.

Layer 26 has circuit lines 62 on surface 26A that connect with vias 50. Layers 32, 34, 36, and 38 have a ground connection 64 that is patterned on surfaces 32A, 34A, 36A and 38A. Layer 40 has a mesh ground plane 66 patterned on surface 40A. Ground pads gnd, RF port pad RF, LO port pad LO and IF port pad IF are patterned on surface 40B and are connected to vias 50. Vias 50 connect the mesh ground plane 66 to ground pads gnd. The mesh ground plane 66 helps to prevent warping of the LTCC structure during fabrication and also acts as an impedance reference plane and reduces cross-talk noise.

The circuit features are formed by screening a thick film paste material and firing in an oven. This process is well known in the art. First, the LTCC layers have via holes punched, the vias are then filled with a conductive material. Next, the circuit features are screened onto the layers. The pads, ground connections, ground plane and circuit lines are formed with a conductive material. The layers are then aligned and stacked on top of each other to form LTCC substrate 22. The LTCC substrate 22 is then fired in an oven at approximately 900 degrees centigrade to form a unitary piece.

After firing, balun T3 and FET transistor die QD1 are attached to top surface 24A by an epoxy (not shown). The FET chip is used in bare die (semiconductor chip) form to reduce size and cost. Wire bonds 78 are placed between connection points on the FET die and wire bond pads L–Q. The FET gates are wire bonded to pads M and N. The FET sources are wire bonded to pads L and R. The FET drains are wire bonded to P and Q. Additional epoxy would be placed over the FET die QD1 after wire bonding for protection.

Balun T3 has windings L5a, L5b and L6a, L6b wound around a ferrite binocular core 80. Core 80 has two apertures 80A and 80B through which the windings pass. Balun T3 has 8 wire ends of its windings welded or soldered to pads A–E and J and K. Pad B is connected to the IF port, pads A, C and E are connected to ground and pads J and K are connected to the nodes J and K. Balun T3 is mounted to surface 24A with an epoxy. The primary of balun T3 is connected to pads B, A and C. The secondary of balun T3 is connected to J, K and E.

A surface mount capacitor C1 is soldered between pads F and G. Either a surface mount capacitor or inductor is soldered between pads H and I for impedance Z1.

Electrical leads (not shown) may be soldered to the pads on surface 40B. Mixer 20 would be mounted to a printed circuit board by soldering either the pads on surface 40B or electrical leads attached to surface 40B to a printed circuit board (not shown).

The electrical performance of mixer 20 is affected by the parasitic capacitance, inductance and resistance of substrate 22 and the circuit features. An electromagnetic simulator was used to model the parasitic elements and to optimize the electrical performance and minimize the effects of the parasitic elements.

A substrate 22 according to the present invention was fabricated having dimensions of 0.25 inches in length by 0.3 inches wide by 0.025 inches in height.

The present invention has several advantages. Since, the baluns T1 and T2 are integrated into substrate 22 on layers 28 and 30, they take up less space, resulting in a smaller package that is easier to assemble and to automate production of. This provides a savings of space on the printed circuit board and allows for a faster assembly process at lower cost. In addition, repeatability of electrical performance is of prime concern. Fabricating the mixer using an LTCC process results in a more uniform electrical performance in the resulting mixer. The LTCC layers have tightly controlled tolerances that provide well defined RF characteristics. The ground plane provides for lower noise.

A version of mixer 20 was optimized for performance in the LO frequency range of 1760 to 1820 Mhz, RF frequency range of 1850–1910 Mhz and a useable IF bandwidth of 70 to 130 Mhz. This mixer was tested for electrical performance and the results are shown graphically in the following figures.

Figure 9:
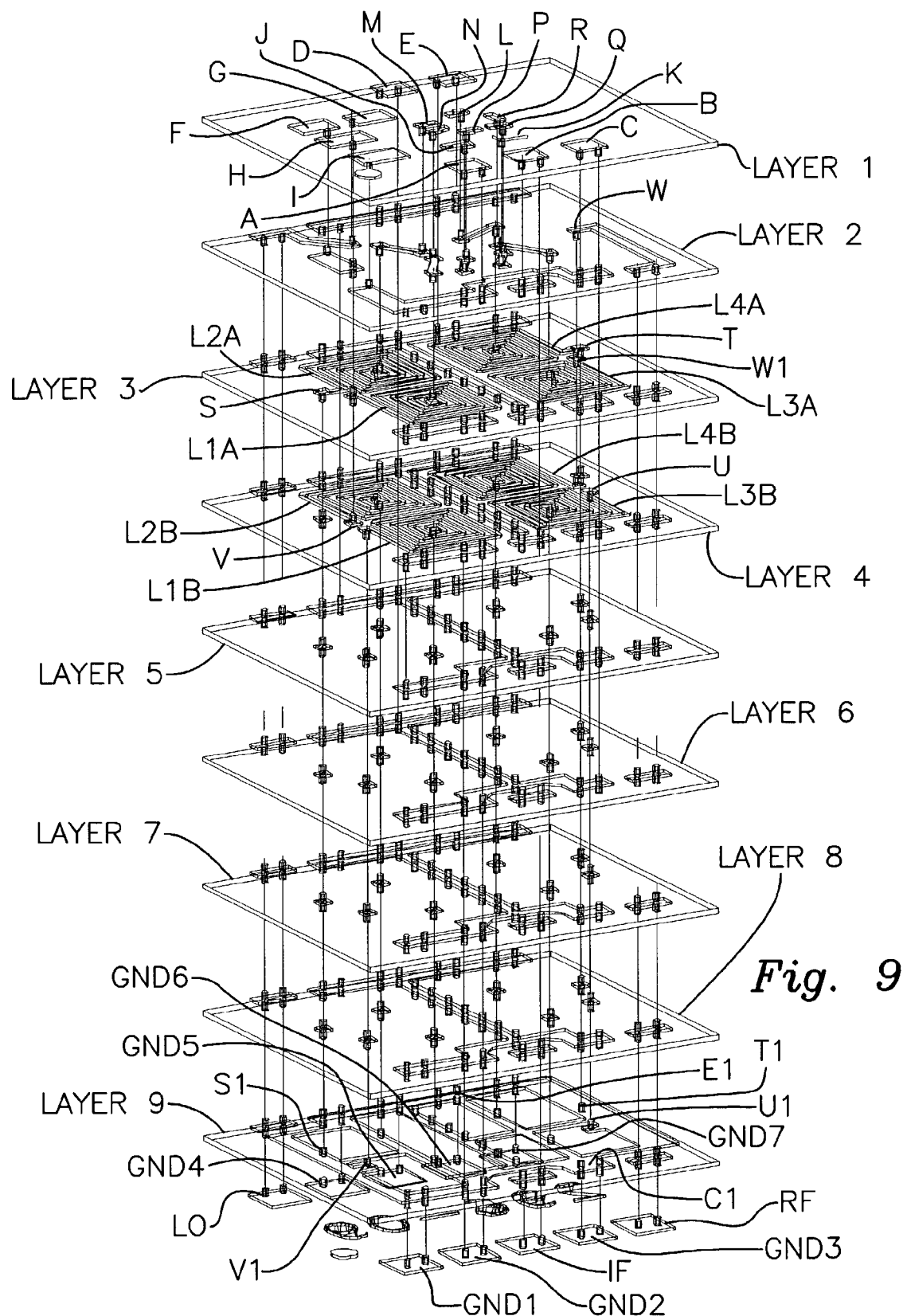
FIG. 9 is an exploded perspective view of the physical layout of the wide bandwidth mixer in accordance with the present invention.
Figure 13:
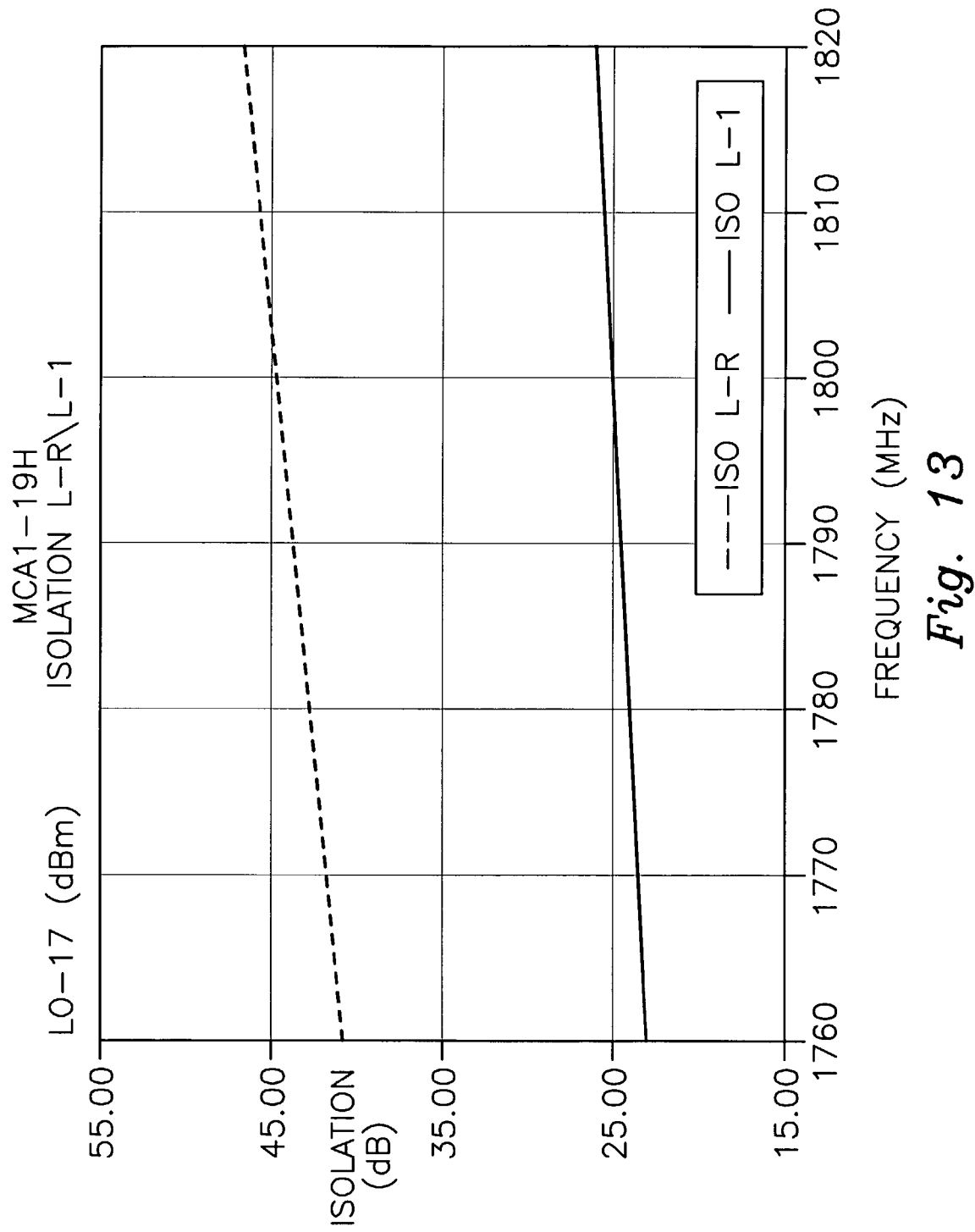
FIG. 13 is a graph of IP3 versus frequency for the mixer of FIG. 9.
Figure 14:
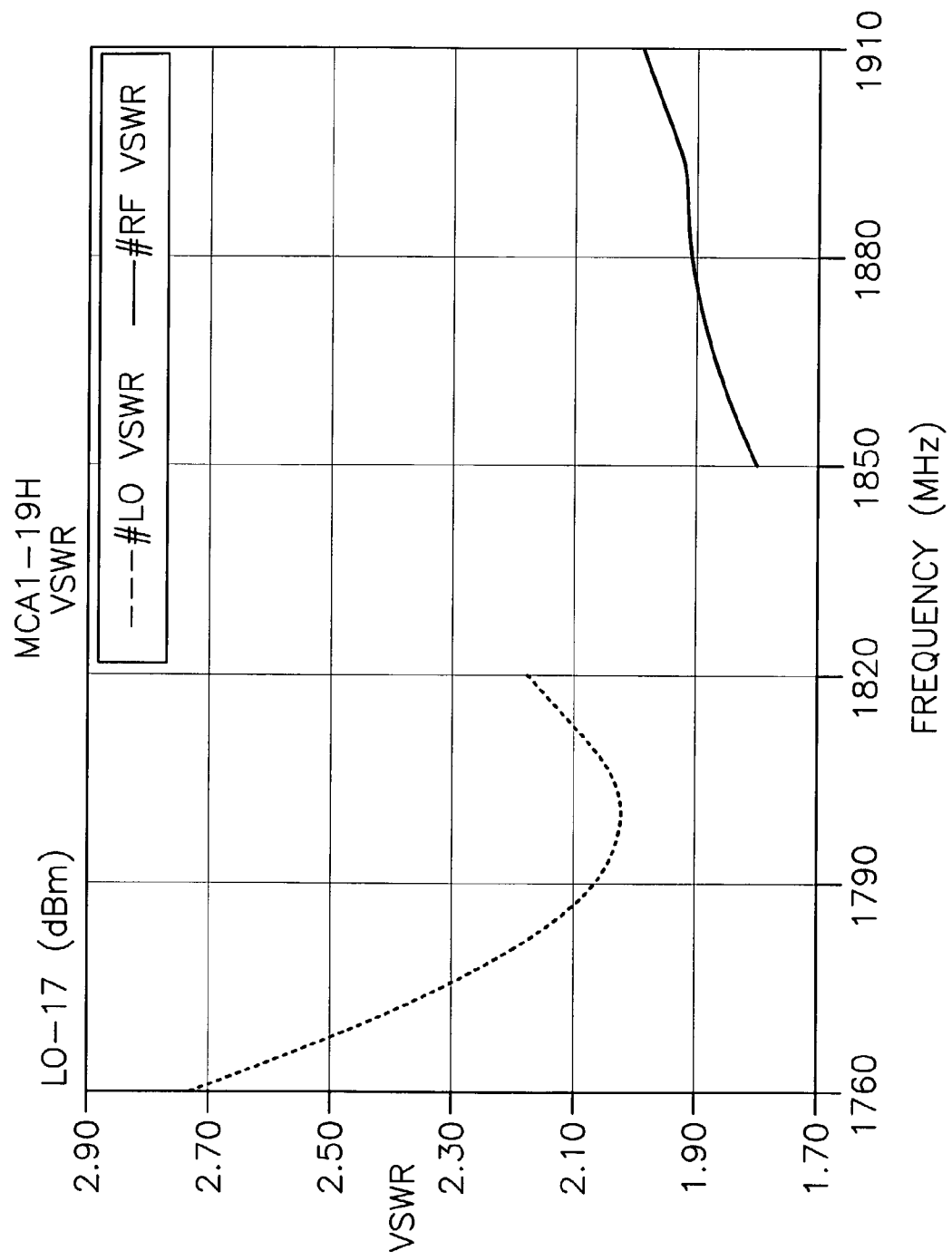
FIG. 14 is a graph of conversion loss versus frequency.
Figure 15:
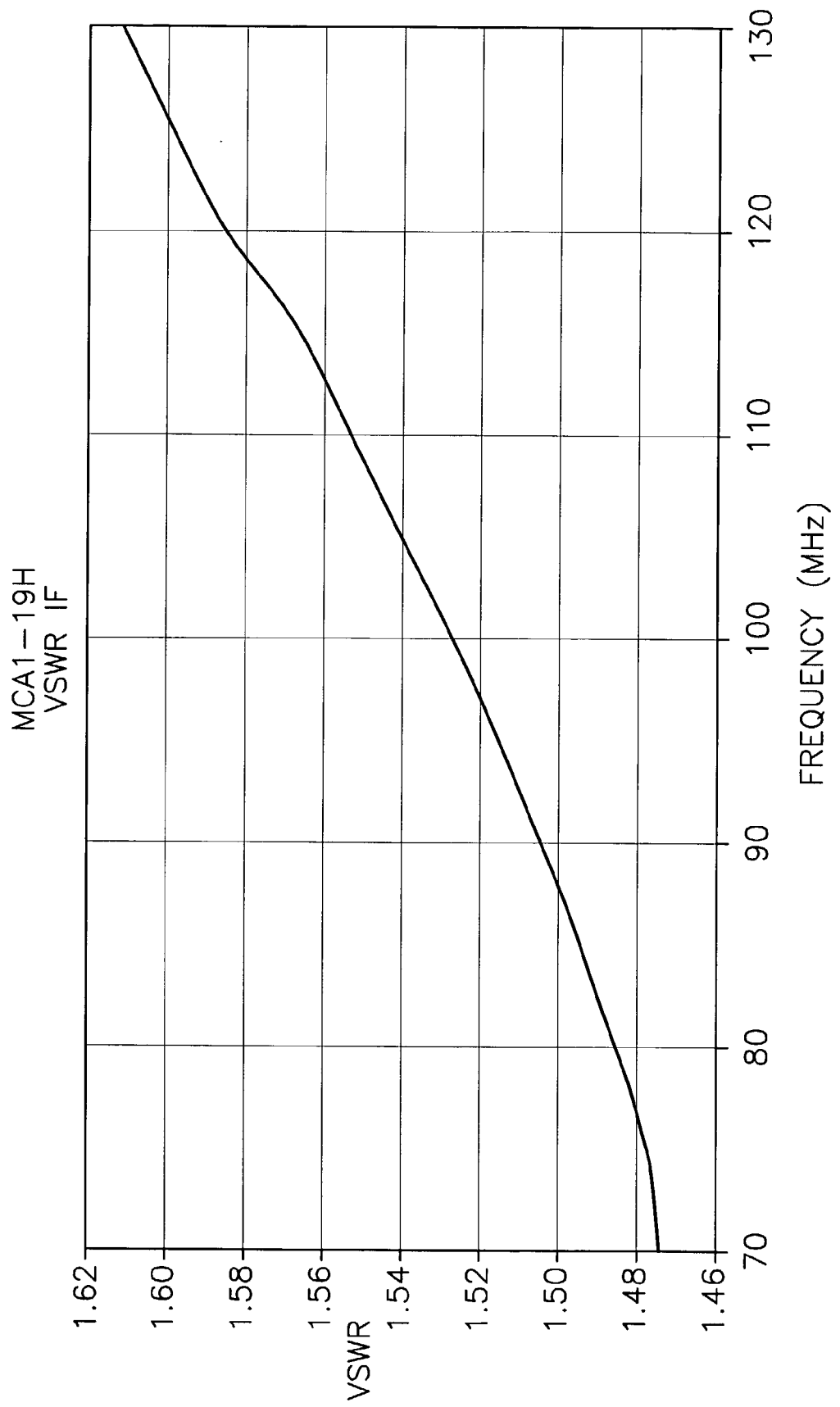
FIG. 15 is a graph of L-R and L-I isolation versus frequency.

FIG. 13 shows the third order intercept point (IP3) versus frequency for the mixer of FIGS. 1 and 9. An IP3 of 35 dBm was obtained using a 17 dBm LO signal. FIG. 14 shows conversion loss versus frequency. The conversion loss was 7.5 dB over the frequency range. FIG. 15 shows a graph of LO port to IF port (L-I) and LO port to RF port (L-R) isolation versus LO frequency for mixer 20. A measurement of approximately 40 dB was obtained for L-R isolation and 20 dB for L-I isolation. FIG. 16 is a graph of VSWR versus frequency for the LO and RF ports. FIG. 17 is a graph of VSWR versus frequency for the IF port.

FIG. 18 is a table of electrical parameters for several mixers that were built to cover three frequency ranges up to 3.6 GHz.

Wide bandwidth mixer 20 is small in size, high in performance, has a high value of IP3, handles a wide range of frequencies, needs fewer manufacturing steps and is low in cost providing an improvement over previous mixers.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A wide bandwidth mixer for mixing an RF input signal with a local oscillator signal to provide at an output an intermediate frequency signal, comprising:
   (a) a plurality of planar ceramic layers, the plurality of planar ceramic layers including a top layer, a bottom layer and inner layers;
   (b) a plurality of vias interconnecting the ceramic layers;
   (c) a plurality of circuit lines located on the ceramic layers and connected to the vias;
   (d) at least one field effect transistor mounted to the top layer and electrically connected to the vias;
   (e) at least one balun mounted on the inner layers and electrically connected to the vias; and
   (f) a transformer mounted to the top layer and electrically connected to the vias.

2. The mixer according to claim 1, wherein the field effect transistor is located in a semiconductor die mounted to the top layer.

3. The mixer according to claim 2, wherein a first and a second balun are mounted on the inner layers and are electrically connected to the vias.

4. The mixer according to claim 3, wherein the first and second baluns each have a first and third winding located on a first inner layer and a second and fourth winding located on a second inner layer, the windings electrically connected to the vias.

5. The mixer according to claim 2, wherein a plurality of bond pads are located on the top surface and are electrically connected to the vias, a plurality of wire bonds electrically connect the semiconductor die to the bond pads.

6. The mixer according to claim 1, wherein a matching network is mounted to the top layer.

7. The mixer according to claim 6, wherein the matching network is connected between the balun and a LO port.

8. The mixer according to claim 7, wherein the matching network is a capacitor and an inductor.

9. A wide bandwidth mixer comprising:
   (a) a planar substrate having a plurality of layers including a top layer, a bottom layer and inner layers;
   (b) a plurality of vias extending through the layers;
   (c) a first and a second balun located on two of the inner layers and electrically connected to the vias;
   (d) a semiconductor die mounted on the top layer and electrically connected to the first and second baluns through the vias;
   (e) a third balun mounted to the top layer and electrically connected to the semiconductor die; and
   (f) a matching network mounted to the top layer and electrically connected to the vias.

10. The mixer according to claim 9, wherein the first and second baluns each have a first and third winding located on one of the inner layers and a second and fourth winding located on another inner layer.

11. The mixer according to claim 9, wherein the third balun has a pair of windings wound on a ferrite core.

12. The mixer according to claim 11, wherein a plurality of bond pads are located on the top surface and are electrically connected to the vias.

13. The mixer according to claim 12, wherein a plurality of wire bonds electrically connect the semiconductor die to the bond pads.

14. The mixer according to claim 11, wherein the pair of windings are electrically connected to the bond pads.

15. The mixer according to claim 11, wherein the semiconductor die and the third balun are attached to the top surface by an epoxy.

16. The mixer according to claim 11, wherein the semiconductor die has four field effect transistors.

17. The mixer according to claim 11, wherein the substrate is formed from a low temperature co-fired ceramic.

18. The mixer according to claim 11, wherein the matching network includes an inductor and a capacitor, the capacitor connected between the first balun and a first port, the inductor connected between the first balun and a ground.

19. The mixer according to claim 11, wherein the matching network includes a first capacitor and a second capacitor, the first capacitor connected between the first balun and a first port, the second capacitor connected between the first balun and a ground.

20. A wide bandwidth mixer comprising:
   (a) a planar substrate formed from a plurality of layers of fired low temperature co-fired ceramic, the substrate including a top layer, a bottom layer and inner layers;
   (b) a plurality of vias extending through the substrate;
   (c) a local oscillator balun and an RF balun located on the inner layers and electrically connected to the vias, the local oscillator balun adapted to receive a local oscillator signal, the RF balun adapted to receive an RF signal;
   (d) an intermediate frequency balun mounted to the top layer and electrically connected to the vias, the intermediate frequency balun adapted to provide an intermediate frequency signal;
   (e) a plurality of field effect transistors mounted on the top layer, the transistors electrically connected to the local oscillator balun, the RF balun and the intermediate frequency balun through the vias, the transistors mixing the local oscillator signal with the RF signal to provide the intermediate frequency signal; and
   (f) a matching network mounted to the top layer and electrically connected to the vias, the matching network matching the impedance of the field effect transistors to that at an LO port.

21. The mixer according to claim 20, wherein the local oscillator balun and the RF balun each have a first and third winding located on a first inner layer and a second and fourth winding located on a second inner layer.

22. The mixer according to claim 20, wherein a plurality of circuit lines are located on the inner layers.

23. The mixer according to claim 20, wherein the first and third windings are magnetically coupled and the second and fourth windings are magnetically coupled.

24. The mixer according to claim 20, wherein the plurality of layers comprise nine layers that are located adjacent each other.

25. The mixer according to claim 20, wherein the matching network comprises:
   a) a first capacitor mounted to the top layer; and
   b) an inductor mounted to the top layer.

26. The mixer according to claim 20, wherein the matching network comprises: a) a first capacitor mounted to the top layer; and b) a second capacitor mounted to the top layer.

27. The mixer according to claim 25, wherein the first capacitor is connected between the local oscillator balun and an LO port.

28. The mixer according to claim 25, wherein the inductor is connected between the local ocillator balun and a ground.

* * * * *